(12) United States Patent
Xu et al.

(10) Patent No.: US 12,052,907 B2
(45) Date of Patent: Jul. 30, 2024

(54) MASK, METHOD FOR FABRICATING MASK AND DRIVE-BACKPLANE MOTHERBOARD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Peng Xu, Beijing (CN); Fengli Ji, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 356 days.

(21) Appl. No.: 17/297,520

(22) PCT Filed: Sep. 11, 2020

(86) PCT No.: PCT/CN2020/114867
§ 371 (c)(1),
(2) Date: May 27, 2021

(87) PCT Pub. No.: WO2021/052259
PCT Pub. Date: Mar. 25, 2021

(65) Prior Publication Data
US 2022/0013753 A1  Jan. 13, 2022

(30) Foreign Application Priority Data
Sep. 17, 2019  (CN) .......................... 201910876549.X

(51) Int. Cl.
| | | |
|---|---|---|
| *C23C 14/04* | (2006.01) |
| *C23C 14/24* | (2006.01) |
| *C23F 1/02* | (2006.01) |
| *H10K 71/00* | (2023.01) |
| *H10K 71/20* | (2023.01) |

(52) U.S. Cl.
CPC ............ *H10K 71/00* (2023.02); *C23C 14/042* (2013.01); *C23C 14/24* (2013.01); *C23F 1/02* (2013.01)

(58) Field of Classification Search
CPC ...... H10K 71/166; C30B 25/04; C23C 14/04; C23C 14/042; C23C 14/044; C23C 16/04; C23C 16/042
USPC .................................................. 118/720–721
See application file for complete search history.

(56) References Cited

U.S. PATENT DOCUMENTS

2005/0250228 A1* 11/2005 Ko ..................... H10K 71/166
                                                        438/21
2007/0063280 A1  3/2007 Shiau et al.
(Continued)

FOREIGN PATENT DOCUMENTS

CN            107099770 A * 8/2017 ........... C23C 14/042

*Primary Examiner* — Aiden Lee
(74) *Attorney, Agent, or Firm* — Lippes Mathias LLP

(57) ABSTRACT

Provided is a mask, including: a plurality of mask pattern regions, a transition region disposed between the plurality of mask pattern regions, and a mask marginal region surrounding the plurality of mask pattern regions and the transition region; wherein the transition region includes at least one first half-etched sub-region with a thickness less than a thickness of the mask marginal region.

14 Claims, 4 Drawing Sheets

(56) References Cited

U.S. PATENT DOCUMENTS

| | | | |
|---|---|---|---|
| 2007/0148337 A1* | 6/2007 | Nichols | H05K 3/143 |
| | | | 118/726 |
| 2011/0279417 A1 | 11/2011 | Kang et al. | |
| 2015/0376765 A1* | 12/2015 | Xiong | C23C 14/042 |
| | | | 118/721 |
| 2018/0355468 A1* | 12/2018 | Wang | H10K 71/00 |
| 2019/0295461 A1 | 9/2019 | Zhou et al. | |

* cited by examiner

MASK, METHOD FOR FABRICATING MASK AND DRIVE-BACKPLANE MOTHERBOARD

This application is a 371 of PCT Application No. PCT/CN2020/114867, filed on Sep. 11, 2020, which claims priority to Chinese Patent Application No. 201910876549.X, filed on Sep. 17, 2019 and entitled "MASK, MASK PREPARATION METHOD AND MOTHER BOARD OF DRIVING BACK PLATE", the disclosures of which are herein incorporated by reference in their entireties.

TECHNICAL FIELD

The present disclosure relates to the field of display technologies, and in particular, relates to a mask, a method for fabricating the mask and a drive-backplane motherboard.

BACKGROUND

At present, a drive-backplane motherboard is fabricated by an evaporation process, in which a mask is attached to the drive-backplane motherboard to define an evaporation region for evaporating a film layer.

SUMMARY

The present disclosure provides a mask, a method for fabricating the mask and a drive-backplane motherboard.

According to an aspect of embodiments of the present disclosure, a mask is provided. The mask includes a plurality of mask pattern regions, a transition region disposed between the plurality of mask pattern regions, and a mask marginal region surrounding the plurality of mask pattern regions and the transition region; wherein the transition region includes at least one first half-etched sub-region with a thickness less than a thickness of the mask marginal region.

Optionally, a ratio of the thickness of the first half-etched sub-region to the thickness of the mask marginal region is greater than or equal to 20% and less than or equal to 50%.

Optionally, the thickness of the first half-etched sub-region is greater than or equal to 20 microns and less than or equal to 50 microns.

Optionally, each of the mask pattern regions includes a plurality of drive-backplane mask patterns, and a minimum distance between the first half-etched sub-region and the drive-backplane mask patterns is greater than 1 millimeter.

Optionally, among the plurality of mask pattern regions, at least two first half-etched sub-regions are arranged in the transition region between a first mask pattern region and a second mask pattern region, and the at least two first half-etched sub-regions are arranged along an arrangement direction of the first mask pattern region and the second mask pattern region.

Optionally, among the plurality of mask pattern regions, at least two first half-etched sub-regions are arranged in the transition region between a first mask pattern region and a second mask pattern region, and an arrangement direction of the at least two first half-etched sub-regions is perpendicular to an arrangement direction of the first mask pattern region and the second mask pattern region.

Optionally, the at least two first half-etched sub-regions are congruent in shape.

Optionally, the at least two first half-etched sub-regions are both stripe-shaped, with a length direction perpendicular to the arrangement direction of the at least two first half-etched sub-regions.

Optionally, the mask pattern regions include a plurality of drive-backplane mask patterns and spacing regions among the plurality of drive-backplane mask patterns, and at least one of the spacing regions includes at least one second half-etched sub-region with a thickness less than the thickness of the mask marginal region.

Optionally, each of the drive-backplane mask patterns is rectangular, and the plurality of drive-backplane mask patterns include at least one column of drive-backplane mask patterns that are arranged along a direction parallel to long sides of the drive-backplane mask patterns, and at least one of the second half-etched sub-region is disposed the spacing region between adjacent drive-backplane mask patterns in the at least one column of the drive-backplane mask patterns.

Optionally, each of the drive-backplane mask patterns is rectangular, and the plurality of drive-backplane mask patterns include at least one row of drive-backplane mask patterns that are arranged along a direction perpendicular to long sides of the drive-backplane mask patterns, and at least one of the second half-etched sub-regions is disposed the spacing region between adjacent drive-backplane mask patterns in the at least one row of the drive-backplane mask patterns.

Optionally, the thickness of the first half-etched sub-region is equal to the thickness of the second half-etched sub-region.

Optionally, a minimum distance between the second half-etched sub-region and the drive-backplane mask patterns is greater than 1 millimeter.

Optionally, a ratio of the thickness of the second half-etched sub-region to the thickness of the mask marginal region is greater than or equal to 20% and less than or equal to 50%.

Optionally, the thickness of the second half-etched sub-region is greater than or equal to 20 microns and less than or equal to 50 microns.

Optionally, at least two second half-etched sub-regions are arranged in the mask pattern regions, and the at least two second half-etched sub-regions are congruent in shape.

Optionally, each of the mask pattern regions includes a plurality of drive-backplane mask patterns and spacing regions among the plurality of drive-backplane mask patterns, and at least one of the spacing regions includes at least one second half-etched sub-region with a thickness less than the thickness of the mask marginal region;

each of the mask pattern regions includes a plurality of drive-backplane mask patterns, and a minimum distance between the first half-etched sub-region and the drive-backplane mask patterns is greater than 1 millimeter;

a ratio of the thickness of the first half-etched sub-region to the thickness of the mask marginal region is greater than or equal to 20% and less than or equal to 50%;

each of the drive-backplane mask pattern is rectangular, and the plurality of drive-backplane mask patterns include at least one column of drive-backplane mask patterns that are arranged along a direction parallel to long sides of the drive-backplane mask patterns, and at least one of the second half-etched sub-region is disposed in the spacing region between adjacent drive-backplane mask patterns in the at least one column of the drive-backplane mask patterns; and a ratio of the thickness of the second half-etched sub-region to the thickness of the mask marginal region is greater than or equal to 20% and less than or equal to 50%.

According to another aspect of the embodiments of the present disclosure, a method for fabricating a mask, applicable to a fabrication of the mask described above is provided. The method includes:

providing a mask substrate; and obtaining a mask by half-etching the mask substrate, wherein the mask includes a plurality of mask pattern regions, a transition region disposed between the plurality of mask pattern regions, and a mask marginal region surrounding the plurality of mask pattern regions and the transition region, and the transition region includes at least one first half-etched sub-region with a thickness less than a thickness of the mask marginal region.

Optionally, the mask pattern regions include a plurality of drive-backplane mask patterns and spacing regions among the plurality of drive-backplane mask patterns, and at least one of the spacing regions includes at least one second half-etched sub-region with a thickness less than the thickness of the mask marginal region.

According to another aspect of the embodiments of the present disclosure, a drive-backplane motherboard is provided. The drive-backplane motherboard is fabricated by any of the masks as described above.

DETAILED DESCRIPTION

The present disclosure is further described in detail below with reference to the accompanying drawings and specific embodiments.

Figure 1:
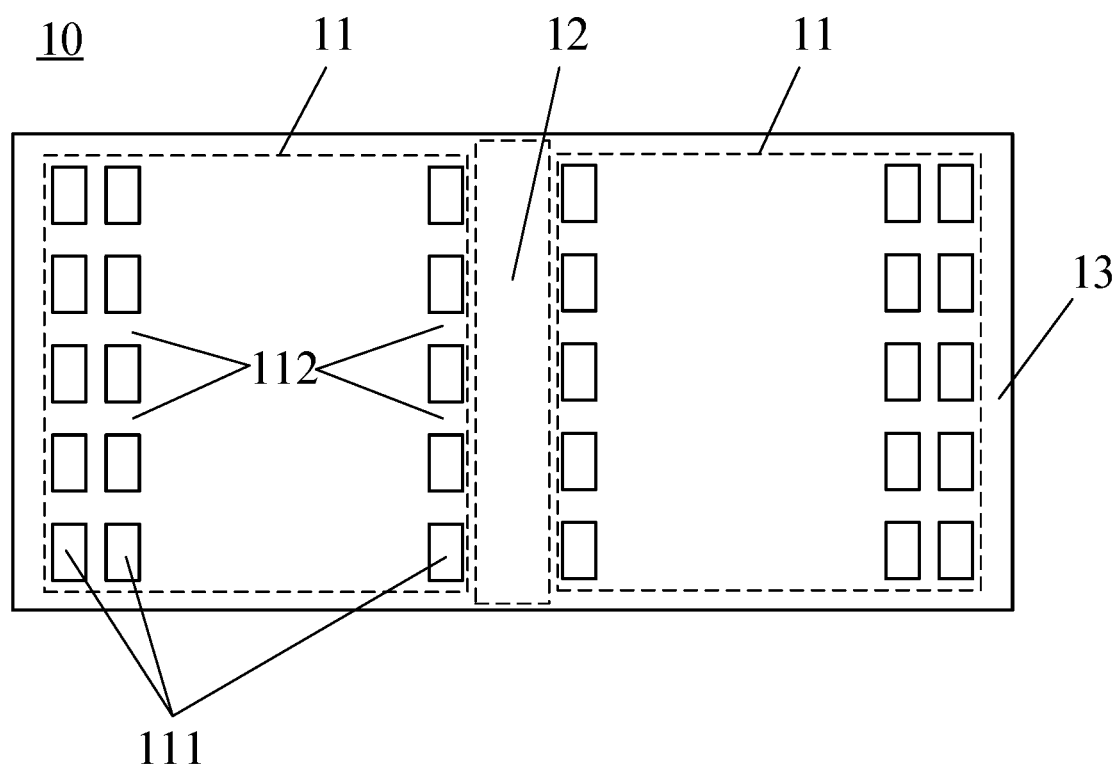
FIG. 1 is a structural schematic diagram of a drive-backplane motherboard.

Before describing the embodiments of the present disclosure, the reasons for the current untight attachment between the mask and the drive-backplane motherboard (which, during the production of the drive backplanes, is a kind of substrate composed of a plurality of drive backplanes and subsequently cut to obtain the plurality of drive backplanes) are analyzed at first. Based on observation and analysis, it is found that when the drive-backplane motherboard is produced by using some production lines, for example, an organic light-emitting diode (OLED) G6 Half production line (OLED G6 Half as the name of a production line), the drive-backplane motherboard is exposed by 4-shot exposure (i.e., 4 exposures), resulting in a wider gap in the middle of the drive-backplane motherboard. FIG. 1 is a drive-backplane motherboard 10. Referring to FIG. 1, the drive-backplane motherboard 10 includes: backplane regions 11, a transition region 12 disposed between the backplane regions 11, and a marginal region 13 surrounding the backplane regions 11 and the transition region 12. The transition region 12 is the wider gap in the middle of the drive-backplane motherboard.

Figure 2:
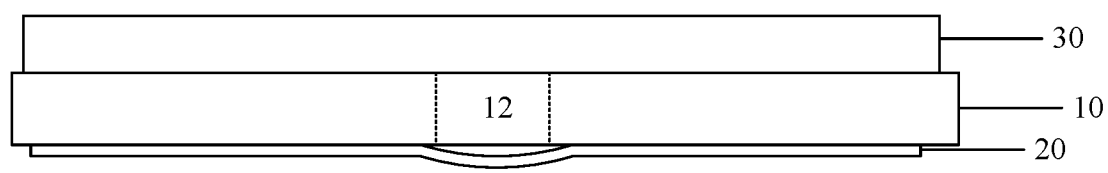
FIG. 2 is a schematic diagram of some structures during an evaporation process.

FIG. 2 is a schematic diagram of some structures during an evaporation process. Wherein a mask 20, a drive-backplane motherboard 10 and an adsorption structure 30 (such as a magnetic adsorption structure) are disposed from the bottom to top in sequence, the mask 20 is attached to the drive-backplane motherboard 10, and the transition region 12 of the drive-backplane motherboard 10 is aligned to the mask 20. Consequently, a stripe-shaped solid material region exists correspondingly in the middle of the mask 20. It is further found that the solid material region disposed in the middle of the mask 20 is heavy, which leads to a large sag when the mask 20 is attached to the drive-backplane motherboard 10, thereby leading to untight attachment. As a result, a manufactured drive backplane is suffered from various undesirable problems such as uneven color mixing and uneven shadow of pixel graphics.

Figure 3:
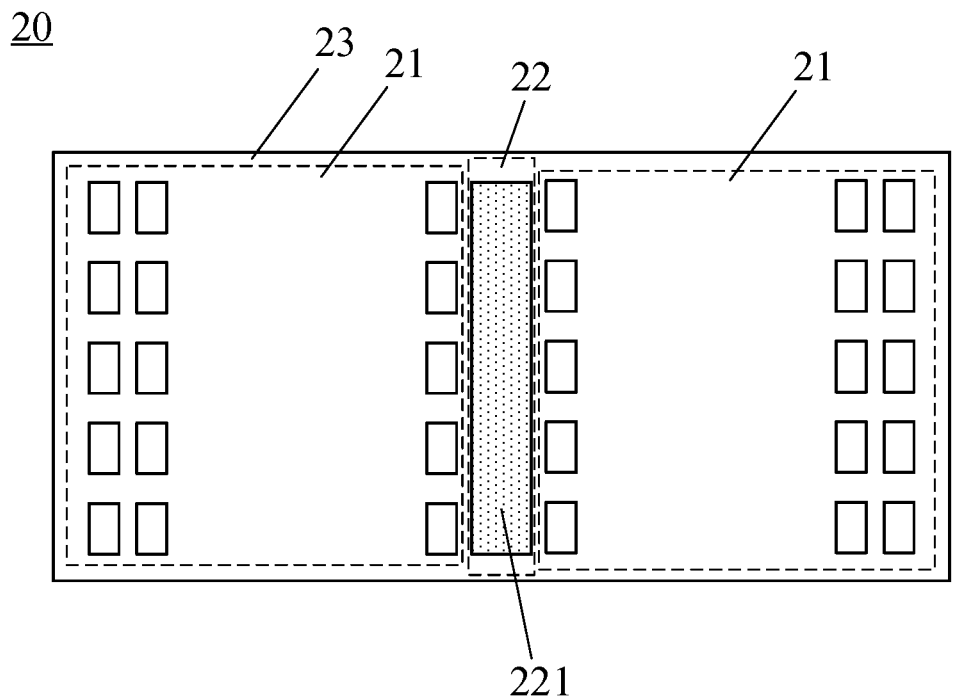
FIG. 3 is a structural schematic diagram of a mask according to an embodiment of the present disclosure.

Referring to FIG. 3, FIG. 3 is a structural schematic diagram of a mask according to an embodiment of the present disclosure. The mask 20 is applicable to the fabrication of the drive-backplane motherboard 10 by the evaporation process. In a practice, the mask 20 is specifically applicable to the fabrication of some structures in display regions of the drive backplanes in the drive-backplane motherboard 10 by the evaporation process. Referring to FIG. 1, the drive-backplane motherboard 10 includes: backplane regions 11, a transition region 12 disposed between the backplane regions 11, and a marginal region 13 surrounding the backplane regions 11 and the transition region 12. A plurality of drive backplanes 111 are arranged in an array in the backplane regions 11.

As illustrated in FIG. 3, the mask 20 includes a plurality of mask pattern regions 21, a transition region 22 disposed between the plurality of mask pattern regions 21, and a mask marginal region 23 surrounding the plurality of mask pattern regions 21 and the transition region 22.

The transition region 22 includes at least one first half-etched sub-region 221 with a thickness less than a thickness of the mask marginal region 23.

The mask pattern regions 21 is configured to form some structures in the display regions of the drive backplanes in the drive-backplane motherboard. The mask marginal region 23 of the mask 20 is aligned with the marginal region 13 of the drive-backplane motherboard 10, and the transition region 22 of the mask 20 is aligned with the transition region 12 of the drive-backplane motherboard 10. That is, when the mask 20 is attached to the drive-backplane motherboard 10 to evaporate a film layer, the mask marginal region 23 of the mask 20 covers the marginal region 13 of the drive-backplane motherboard 10, and the transition region 22 of the mask 20 covers the transition region 12 of the drive-backplane motherboard 10. Referring to FIG. 3, the transition region 22 includes at least one first half-etched sub-region 221 with a thickness less than a thickness of the mask marginal region 23.

In an embodiment of the present disclosure, at least one first half-etched sub-region 221 is disposed in the transition region 22 of the mask 20, i.e., a region of the mask 20 corresponding to the transitional region 12 of the drive-backplane motherboard. Since the thickness of the first half-etched sub-region 221 is less than the thickness of the mask marginal region 23 of the mask 20 which corresponds to the marginal region 13 of the drive-backplane motherboard 10, the weight of the middle of the mask 20 is reduced. In this way, the sag of the mask 20 can be reduced when the mask 20 is attached to the drive-backplane motherboard 10, such that the mask 20 and the drive-backplane motherboard 10 can be attached more tightly, thereby avoiding various undesirable problems of the manufactured drive backplane.

Optionally, a ratio of the thickness of the first half-etched sub-region 221 to the thickness of the mask marginal region 23 is greater than or equal to 20% and less than or equal to 50%. In this way, the weight of the mask 20 can be reduced while the strength of the mask 20 can be guaranteed. In a practice, the thickness of the mask marginal region 23 is 100 microns, and accordingly, the thickness of the first half-etched sub-region 221 is greater than or equal to 20 microns and less than or equal to 50 microns.

Optionally, referring to FIG. 1, the back-plane region 11 includes: drive backplanes 111 and a motherboard gap 112 between the drive backplanes 111. Accordingly, referring to FIG. 4, the mask 20 further includes: a plurality of drive-backplane mask patterns 24 and spacing regions 25 among the plurality of drive-backplane mask patterns 24, wherein at least one of the spacing regions 25 includes at least one second half-etched sub-region 251 with a thickness less than the thickness of the mask marginal region 23.

The spacing regions 25 corresponds to the motherboard gaps 112 in the drive-backplane motherboard 10.

In an embodiment of the present disclosure, at least one of the second half-etched sub-region 251 is disposed in the spacing regions 25 of the mask 20, i.e., the regions of the mask 20 corresponding to the motherboard gaps 112 of the drive-backplane motherboard. Since the thickness of the second half-etched sub-region 251 is less than the thickness of the mask marginal region 23 of the mask 20 corresponding to the marginal region 13 of the drive-backplane motherboard 10, the weight of regions of the mask 20 corresponding to the motherboard gaps 112 may be reduced. In this way, the sag of the mask 20 can be reduced when the mask is attached to the drive-backplane motherboard 10, such that the mask 20 and the drive-backplane motherboard 10 can be attached more tightly, thereby avoiding various undesirable problems of the manufactured drive backplane.

Optionally, a ratio of the thickness of the second half-etched sub-region 251 to the thickness of the mask marginal region 23 is greater than or equal to 20% and less than or equal to 50%. In this way, the weight of the mask 20 can be reduced while the strength of the mask 20 can be guaranteed. In a practice, the thickness of the mask marginal region 23 is 100 microns, and accordingly, the thickness of the second half-etched sub-region 251 is greater than or equal to 20 microns and less than or equal to 50 microns.

As illustrated in FIG. 3, the mask 20 further involves that a minimum distance between the first half-etched sub-regions 221 and the drive-backplane mask patterns 24 is greater than 1 millimeter.

The drive backplanes 111 have non-display regions on the peripheries, and the width of each of the non-display regions is typically 1 millimeter. Therefore, a distance between each of the first half-etched sub-regions 221 and each of the drive-backplane mask patterns 24 may be allowed to be greater than 1 millimeter. In such a structure, the non-display regions on the peripheries of the drive backplanes 111 may correspond to mask regions with a larger thickness between the first half-etched sub-regions 221 and the drive-backplane mask patterns 24, thereby providing a better protection to devices in the non-display regions during the evaporation process. In addition, since the hollowing of the drive-backplane mask patterns 24 is larger due to the fact that the drive-backplane mask patterns 24 of the mask 20 are configured to prepare display regions of the drive backplanes 111, the connection strength between the regions of the mask 20 may also be ensured when the distance between each of the first half-etched sub-regions 221 and each of the drive-backplane mask patterns 24 is greater than 1 millimeter.

Similarly, a minimum distance between the second half-etched sub-regions 251 and the drive-backplane mask patterns 24 is also greater than 1 millimeter. In this way, the non-display regions on the peripheries of the drive backplanes 111 may correspond to mask regions with a larger thickness between the second half-etched sub-regions 251 and the drive-backplane mask patterns 24, thereby providing a better protection to devices in the non-display regions in the evaporation process. In addition, the connection strength between the regions of the mask 20 may also be ensured.

Figure 4:
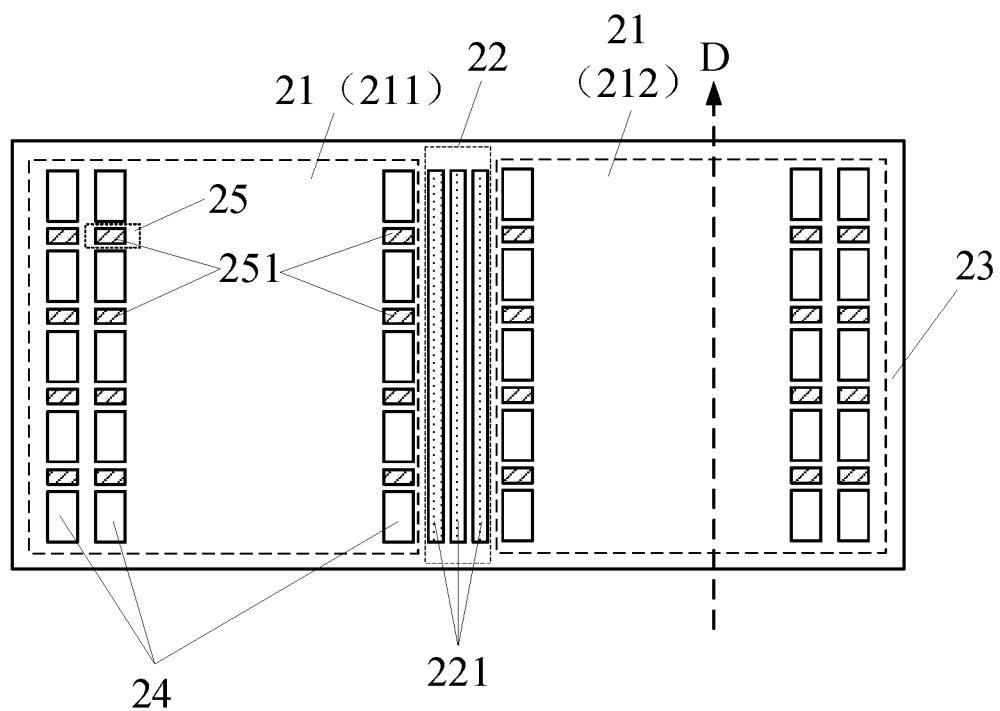
FIG. 4 is a structural schematic diagram of another mask according to an embodiment of the present disclosure.

In an optional embodiment, referring to FIG. 4, each of the drive-backplane mask patterns 24 is rectangular, and the plurality of drive-backplane mask patterns 24 include at least one column of drive-backplane mask patterns 24 that are arranged along a direction D parallel to long sides of the drive-backplane mask patterns 24, and at least one of the second half-etched sub-region 251 is disposed in the spacing region 25 between adjacent drive-backplane mask patterns 24 in the at least one column of the drive-backplane mask patterns (24). That is, in any column of the drive-backplane mask patterns 24, the second half-etched sub-regions may be disposed between some of the drive-backplane mask patterns 24, or the second half-etched sub-region 251 may be also disposed between every two drive-backplane mask patterns 24.

In the direction D parallel to the long sides of the drive-backplane mask patterns 24, a spacing between adjacent backplane mask patterns 24 in a column of backplane mask patterns 24 is about 12-15 millimeters; and in the direction perpendicular to the long sides of the drive-backplane mask patterns 24, a spacing between adjacent drive-backplane mask patterns 24 is about 9 millimeters. That is, compared with a horizontal spacing between adjacent drive-backplane mask patterns 24, a longitudinal spacing between adjacent drive-backplane mask patterns 24 is larger. Therefore, by disposing the second half-etched sub-region 251 only in a region between two drive-backplane mask patterns 24 in the direction D parallel to the long sides of the drive-backplane mask patterns 24, rather than at other positions, the weight of the mask 20 can be reduced while the strength of the mask 20 can be guaranteed.

Without doubt, optionally, the drive-backplane mask patterns 24 include at least one row of drive-backplane mask patterns 24 that are arranged along a direction perpendicular to long sides of the drive-backplane mask patterns 24, and at least one of the second half-etched sub-regions 251 is disposed in the spacing region 25 between adjacent drive-backplane mask patterns 24 in the at least one row of the drive-backplane mask patterns 24. Similarly, in any row of the drive-backplane mask patterns 24, the second half-etched sub-regions may be disposed between some of the drive-backplane mask patterns 24, or the second half-etched sub-region 251 may be also disposed between every two drive-backplane mask patterns 24. This is not specifically limited in the embodiments of the present disclosure.

It should be noted that in the mask illustrated in FIG. 4, only 3 columns of drive-backplane mask patterns 24 are illustrated in each mask pattern region (211 and 212), but other drive-backplane mask patterns 24 may also be arranged. For example, the drive-backplane mask patterns 24 may spread over the entire mask pattern regions. This is not limited in the embodiments of the present disclosure.

Figure 5:
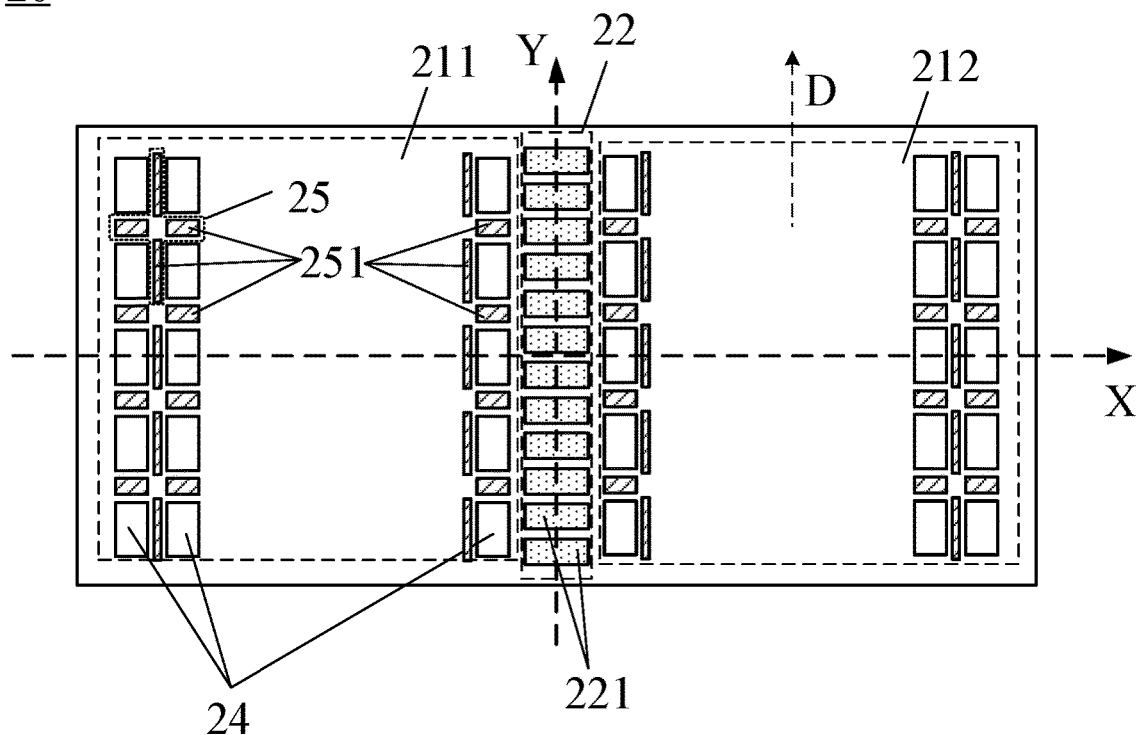
FIG. 5 is a structural schematic diagram of yet another mask according to an embodiment of the present disclosure.
Figure 6:
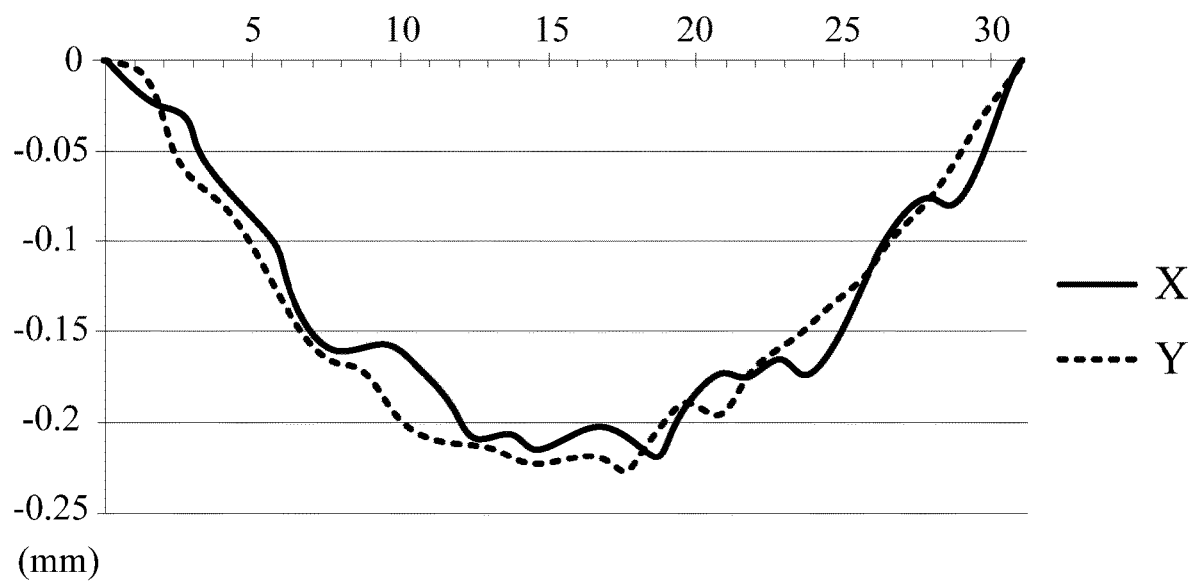
FIG. 6 is a data graph of a sag test on a mask according to an embodiment of the present disclosure.

A sag test was performed on the mask according to an embodiment of the present disclosure to obtain a data graph of the sag test, as illustrated in FIG. 6. Referring to FIG. 6, the ordinate represents sag in millimeters (mm), with a minus sign indicating a downward sagging direction; and the abscissa shows the grades of test points along directions X and Y, with the directions X and Y as illustrated in FIG. 5. During the test, 31 test points with the same spacing therebetween may be selected along the direction X, 31 test points with the same spacing therebetween may be selected along the direction Y, and then the sag of these 62 test points may be measured to obtain the data graph of the sag test as illustrated in FIG. 6. Referring to FIG. 6, it can be seen that the maximum sag of the mask according to an embodiment of the present disclosure is about 0.22 millimeters, which meets the requirement that the sag should be less than or equal to 0.25 millimeters. Therefore, the mask according to the embodiment of the present disclosure may be more tightly attached to the drive-backplane motherboard during the evaporation process.

Optionally, as illustrated in FIG. 4, among the plurality of mask pattern regions, at least two first half-etched sub-regions 221 are arranged in the transition region 22 between a first mask pattern region 211 and a second mask pattern region 212, and an arrangement direction of the at least two first half-etched sub-regions 221 is parallel to an arrangement direction of the first mask pattern region 211 and the second mask pattern region 212 (in FIG. 4, the arrangement direction of the at least two first half-etched sub-regions 221 is perpendicular to the direction D of the long sides of the drive-backplane mask patterns 24).

Optionally, as illustrated in FIG. 5, an arrangement direction of the at least two first half-etched sub-regions 221 is perpendicular to an arrangement direction of the first mask pattern region 211 and the second mask pattern region 212 (in FIG. 5, the arrangement direction of the at least two first half-etched sub-regions 221 is parallel to the direction D of the long sides of the drive-backplane mask patterns 24).

It should be noted that the first half-etched sub-regions 221 and the second half-etched sub-regions 251 may have a variety of shapes, numbers, and arrangements, which may be freely selected according to needs in the practice. This is not limited in the embodiments of the present disclosure. Optionally, the mask includes at least two first half-etched sub-regions, which are congruent in shape; and if the mask includes at least two second half-etched sub-regions, the at least two second half-etched sub-regions are congruent in shape. The first half-etched sub-regions or the second half-etched sub-regions are congruent in shape, which may facilitate the manufacture of the half-etched sub-regions and may balance the stresses on each region.

Figure 7:
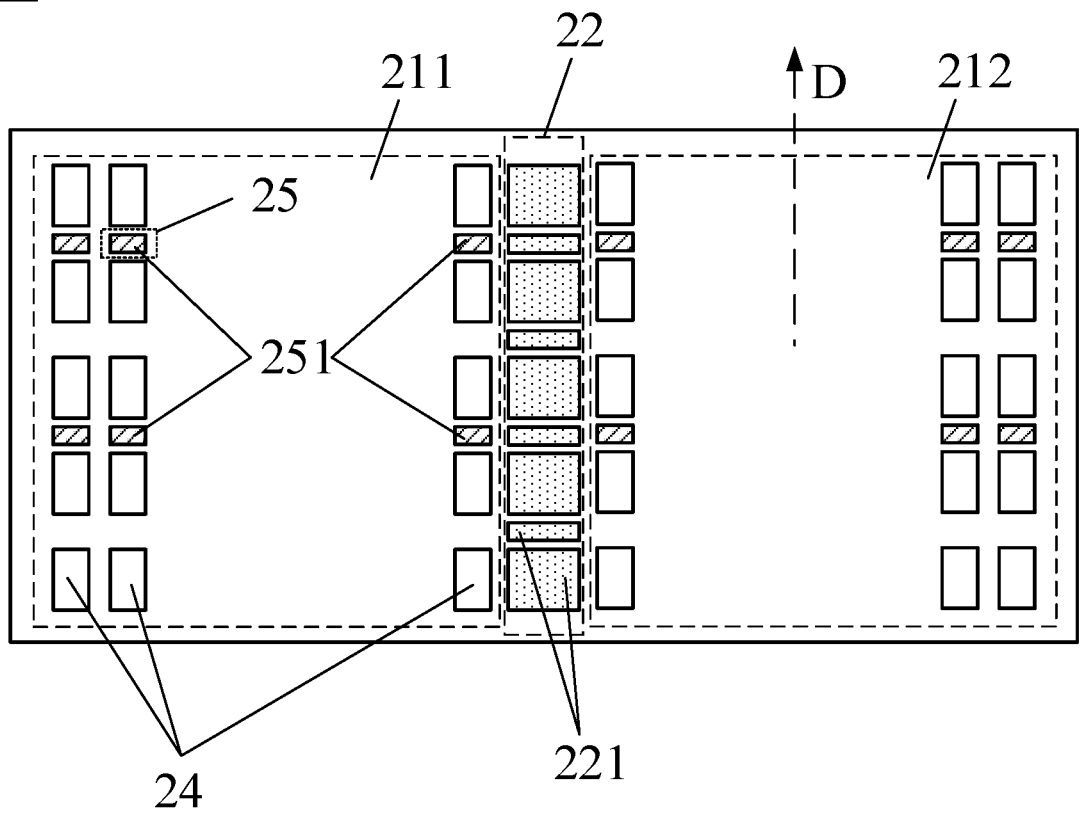
FIG. 7 is a structural schematic diagram of still another mask according to an embodiment of the present disclosure.

For example, referring to FIG. 3, one first half-etched sub-region 221 may be disposed, and the first half-etched sub-region 221 is stripe-shaped. Referring to FIG. 4, a plurality of first half-etched sub-regions 221 with the same size and shape may also be disposed, and the respective first half-etched sub-regions 221 is stripe-shaped, and may be arranged in parallel along a direction D perpendicular to the long sides of the drive-backplane mask patterns 24. Referring to FIG. 5, a plurality of first half-etched sub-regions 221 with the same size and shape may also be disposed, and the respective first half-etched sub-regions 221 may be stripe-shaped, and may be arranged in parallel along a direction D parallel to the long sides of the drive-backplane mask patterns 24. Referring to FIG. 7, a plurality of first half-etched sub-regions 221 with the different size and shape may also be disposed, and may be arranged in parallel along the direction D parallel to the long sides of the drive-backplane mask patterns 24.

For another example, referring to FIGS. 4 and 5, one second half-etched sub-region 251 may be disposed between every adjacent drive-backplane mask patterns 24 in the direction D parallel to the long sides of the drive-backplane mask patterns 24. Referring to FIG. 7, one second half-etched sub-region 251 may be also disposed between some adjacent drive-backplane mask patterns 24 in the direction D parallel to the long sides of the drive-backplane mask patterns 24, instead of disposing one second half-etched sub-region 251 between every adjacent drive-backplane mask patterns 24.

In an embodiment of the present disclosure, at least one first half-etched sub-region is disposed in the mask transition region, i.e., a region of the mask corresponding to the transitional region of the drive-backplane motherboard. Since the thickness of the first half-etched sub-region is less than the thickness of the mask marginal region of the mask which corresponds to the marginal region of the drive-backplane motherboard, the weight of the middle of the mask is reduced. In this way, the sag of the mask can be reduced when the mask is attached to the drive-backplane motherboard, such that the mask and the drive-backplane motherboard can be attached more tightly, thereby avoiding various undesirable problems of the manufactured drive backplane.

Figure 8:
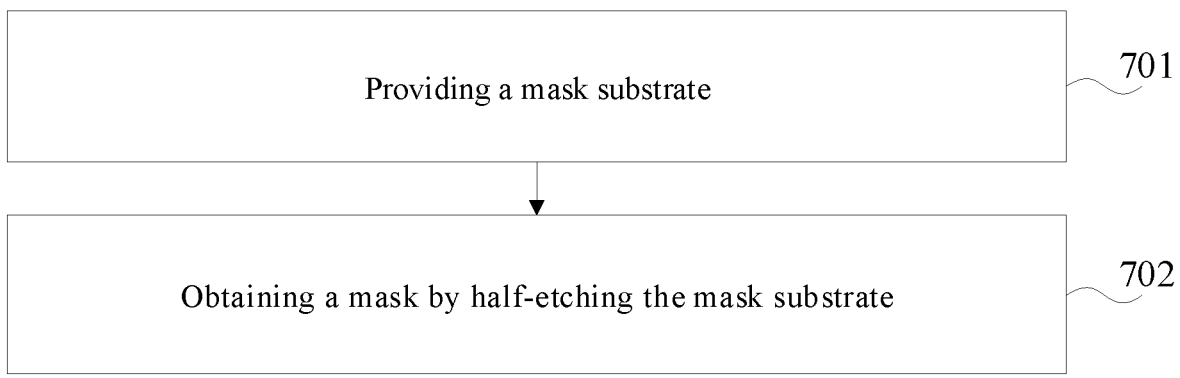
FIG. 8 is a flowchart showing a method for fabricating a mask according to an embodiment of the present disclosure.

Referring to FIG. 8, it illustrates a flowchart of a method for fabricating a mask according to an embodiment of the present disclosure. The mask is applicable to a fabrication of a drive-backplane motherboard by an evaporation process. The drive-backplane motherboard includes: backplane regions, a transition region disposed between the backplane regions, and a marginal region surrounding the backplane regions and the transition region. The method may specifically include the following steps.

In step 701, a mask substrate is provided.

In this step, the mask substrate is provided first. Optionally, the mask may be INVAR (a nickel-iron alloy containing 35.4% of nickel).

In step 702, a mask is obtained by half-etching the mask substrate.

The mask includes a plurality of mask pattern regions, a transition region disposed between the plurality of mask pattern regions, and a mask marginal region surrounding the plurality of mask pattern regions and the transition region, and the transition region includes at least one first half-etched sub-region with a thickness less than a thickness of the mask marginal region. During the half-etching of the mask substrate, the mask substrate may include a variety of regions with different thicknesses, wherein a ratio of the thickness of each region to the thickness of the mask substrate may be in a range of 0-1, a thickness ratio of hollow regions is 0, and a thickness ratio of unetched regions is 1.

In this step, the half-etching may be performed in the transition region of the mask substrate, such that at least one first half-etched sub-region is etched in the transition region.

In an embodiment of the present disclosure, at least one first half-etched sub-region is disposed in the transition region of the mask, i.e., a region of the mask corresponding to the transitional region of the drive-backplane motherboard. Since the thickness of the first half-etched sub-region is less than the thickness of the mask marginal region of the mask which corresponds to the marginal region of the drive-backplane motherboard, the weight of the middle of the mask can be reduced. In this way, the sag of the mask can be reduced when the mask is attached to the drive-backplane motherboard, such that the mask and the drive-backplane motherboard can be attached more tightly, thereby avoiding various undesirable problems of the manufactured drive backplane.

Optionally, a ratio of the thickness of the first half-etched sub-region to the thickness of the mask marginal region is greater than or equal to 20% and less than or equal to 50%. In this way, the weight of the mask can be reduced while the strength of the mask can be guaranteed. The thickness of the mask marginal region may be 100 microns, and accordingly, the thickness of the first half-etched sub-region may be greater than or equal to 20 microns and less than or equal to 50 microns.

Optionally, the backplane regions include drive backplanes and motherboard gaps between the drive backplanes. Accordingly, the mask substrate further includes spacing regions corresponding to the motherboard gaps. In this way, the method may further include the following step: obtaining at least one second half-etched sub-region by half-etching the spacing regions. The thickness of the second half-etched sub-region is less than the thickness of the mask marginal region.

In this step, the half-etching may be performed in the spacing regions of the mask substrate, such that at least one second half-etching sub-region is etched in the spacing regions, wherein the thickness of each of the second half-etching sub-region less than the thickness of the mask marginal region.

In an embodiment of the present disclosure, at least one second half-etched sub-region is disposed in the spacing regions of the mask, i.e., the regions of the mask corresponding to the motherboard gaps of the drive-backplane motherboard. Since the thickness of the second half-etched sub-region is less than the thickness of the mask marginal region of the mask which corresponds to the marginal region of the drive-backplane motherboard, the weight of regions of the mask corresponding to the motherboard gaps may be reduced. In this way, the sag of the mask can be reduced when the mask is attached to the drive-backplane motherboard, such that the mask and the drive-backplane motherboard can be attached more tightly, thereby avoiding various undesirable problems of the manufactured drive backplane.

Optionally, a ratio of the thickness of the second half-etched sub-region to the thickness of the mask marginal region is greater than or equal to 20% and less than or equal to 50%. In this way, the weight of the mask can be reduced while the strength of the mask can be guaranteed. The thickness of the mask marginal region may be 100 microns, and accordingly, the thickness of the second half-etched sub-region may be greater than or equal to 20 microns and less than or equal to 50 microns.

It should be noted that the first half-etched sub-regions and the second half-etched sub-regions may have a variety of shapes, numbers, and arrangements, which may be freely selected according to needs in the practice. This is not limited in the embodiments of the present disclosure. A reference may be made to the related content in the embodiments above for the exemplary shapes, numbers, and arrangements of the first and second half-etched sub-regions, which are not be repeated here in this embodiment.

In an embodiment of the present disclosure, at least one first half-etched sub-region is etched in a region of the mask corresponding to the transitional region of the drive-backplane motherboard. Since the thickness of the first half-etched sub-region is less than the thickness of a mask marginal region of the mask which corresponds to the marginal region of the drive-backplane motherboard, the weight of the middle of the mask is reduced. In this way, the sag of the mask can be reduced when the mask is attached to the drive-backplane motherboard, such that the mask and the drive-backplane motherboard can be attached more tightly, thereby avoiding various undesirable problems of the manufactured drive backplane.

An embodiment of the present disclosure also provides a drive-backplane motherboard, which is fabricated by the mask according to any one of the embodiments described above.

For the sake of simplicity in description, the foregoing method embodiments are described as a combination of a sequence of acts. However, a person skilled in the art shall be informed that the present disclosure is not limited by the described order of acts, as some steps could, in accordance with the present disclosure, occur in other orders or concurrently. Further, a person skilled in the art shall also be informed that the embodiments as described in the Description are preferred embodiments, in which the acts and modules involved are not necessarily required by the present invention.

All the embodiments in the Description are described in a progressive fashion, with each embodiment focusing on the description of its differences from other embodiments. The embodiments may be referred to each other for the same or similar parts.

It should also be noted that as used herein, relational terms such as first and second are only used to distinguish one entity or operation from another entity or operation, and do not necessarily require or imply such an actual relationship or order between these entities or operations. Moreover, the terms "comprise", "include" or any other variants thereof are intended to cover non-exclusive inclusion, such that a process, method, commodity or device including a sequence of elements not only includes those elements, but also includes other elements that are not explicitly listed, or also includes elements inherent to this process, method, commodity or device. Without any more limitation, an element defined by a statement "comprises a . . . " does not exclude the existence of other identical elements in the process, method, commodity, or device including said element.

The mask, the method for fabricating the mask and the drive-backplane motherboard according to the present disclosure have been described in detail above. Specific examples are used herein to explain the principles and embodiments of the present disclosure. The embodiments are described above merely for understanding the method and the core idea of the present disclosure. Meanwhile, for a person of ordinary skills in the art, there will be changes in the specific embodiments and the application scope based on the idea of the present disclosure. In summary, the content of the Description should not be understood as posing a limit on the present disclosure.

What is claimed is:

1. A mask, comprising a plurality of mask pattern regions, a transition region disposed between the plurality of mask pattern regions, and a mask marginal region surrounding the plurality of mask pattern regions and the transition region;
   wherein the transition region comprises at least one first half-etched sub-region with a thickness less than a thickness of the mask marginal region;
   the plurality of mask pattern regions comprise a plurality of drive-backplane mask patterns and spacing regions among the plurality of drive-backplane mask patterns, at least one of the spacing regions comprising at least one second half-etched sub-region with a thickness less than the thickness of the mask marginal region; and the plurality of drive-backplane mask patterns comprise at least one column of drive-backplane mask patterns that are arranged along a direction parallel to long sides of the drive-backplane mask patterns and at least one row of drive-backplane mask patterns that are arranged along a direction perpendicular to the long sides of the drive-backplane mask patterns, wherein one second half-etched sub-region with a rectangular shape is disposed in a first spacing region between adjacent drive-backplane mask patterns in the at least one column of the drive-backplane mask patterns, one second half-etched sub-region with a rectangular shape is disposed in a second spacing region between adjacent drive-backplane mask patterns in the at least one row of the drive-backplane mask patterns, no other position is provided with the second half-etched sub-region, and a width of the second half-etched sub-region in the first spacing region is greater than a width of the second half-etched sub-region in the second spacing region.

2. The mask according to claim 1, wherein a ratio of the thickness of the first half-etched sub-region to the thickness of the mask marginal region is greater than or equal to 20% and less than or equal to 50%.

3. The mask according to claim 2, wherein the thickness of the first half-etched sub-region is greater than or equal to 20 microns and less than or equal to 50 microns.

4. The mask according to claim 1, wherein a minimum distance between the first half-etched sub-region and the drive-backplane mask patterns being greater than 1 millimeter.

5. The mask according to claim 1, wherein among the plurality of mask pattern regions, at least two first half-etched sub-regions are arranged in the transition region between a first mask pattern region and a second mask pattern region, the at least two first half-etched sub-regions being arranged along an arrangement direction of the first mask pattern region and the second mask pattern region.

6. The mask according to claim 5, wherein the at least two first half-etched sub-regions are congruent in shape.

7. The mask according to claim 6, wherein the at least two first half-etched sub-regions are both stripe-shaped, with a length direction perpendicular to the arrangement direction of the at least two first half-etched sub-regions.

8. The mask according to claim 1, wherein among the plurality of mask pattern regions, at least two first half-etched sub-regions are arranged in the transition region between a first mask pattern region and a second mask pattern region, an arrangement direction of the at least two first half-etched sub-regions being perpendicular to an arrangement direction of the first mask pattern region and the second mask pattern region.

9. The mask according to claim 1, wherein the thickness of the first half-etched sub-region is equal to the thickness of the second half-etched sub-region.

10. The mask according to claim 1, wherein a minimum distance between the second half-etched sub-region and the drive-backplane mask patterns is greater than 1 millimeter.

11. The mask according to claim 1, wherein a ratio of the thickness of the second half-etched sub-region to the thickness of the mask marginal region is greater than or equal to 20% and less than or equal to 50%.

12. The mask according to claim 11, wherein the thickness of the second half-etched sub-region is greater than or equal to 20 microns and less than or equal to 50 microns.

13. The mask according to claim 1, wherein at least two second half-etched sub-regions are arranged in the mask pattern regions, the at least two second half-etched sub-regions being congruent in shape.

14. The mask according to claim 1, wherein a minimum distance between the first half-etched sub-region and the drive-backplane mask patterns is greater than 1 millimeter;
  a ratio of the thickness of the first half-etched sub-region to the thickness of the mask marginal region is greater than or equal to 20% and less than or equal to 50%; and
  a ratio of the thickness of the second half-etched sub-region to the thickness of the mask marginal region is greater than or equal to 20% and less than or equal to 50%.

* * * * *